（12）United States Patent
Han

(10) Patent No.: US 9,161,469 B2
(45) Date of Patent: Oct. 13, 2015

(54) PORTABLE ELECTRONIC APPARATUS

(71) Applicant: Samsung Electronics Co., Ltd., Suwon-si, Gyeonggi-do (KR)

(72) Inventor: Jae-uk Han, Osan-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 273 days.

(21) Appl. No.: 13/852,125

(22) Filed: Mar. 28, 2013

(65) Prior Publication Data
US 2014/0043735 A1 Feb. 13, 2014

(30) Foreign Application Priority Data

Aug. 8, 2012 (KR) .................. 10-2012-0086791

(51) Int. Cl.
H05K 7/00 (2006.01)
G06F 1/16 (2006.01)
(52) U.S. Cl.
CPC ............... *H05K 7/00* (2013.01); *G06F 1/1618* (2013.01); *G06F 1/1679* (2013.01)
(58) Field of Classification Search
CPC combination set(s) only.
See application file for complete search history.

(56) References Cited

U.S. PATENT DOCUMENTS

| | | | | |
|---|---|---|---|---|
| 6,366,440 | B1* | 4/2002 | Kung | 361/147 |
| 6,870,732 | B2* | 3/2005 | Huang et al. | 361/679.17 |
| 7,221,562 | B2* | 5/2007 | Song | 361/679.06 |
| 2005/0018393 | A1* | 1/2005 | Kuo et al. | 361/683 |
| 2005/0101358 | A1 | 5/2005 | Carpenter | |
| 2005/0128695 | A1* | 6/2005 | Han | 361/683 |
| 2005/0236848 | A1 | 10/2005 | Kim | |
| 2005/0288076 | A1* | 12/2005 | Seol | 455/575.4 |
| 2006/0056140 | A1* | 3/2006 | Lev | 361/683 |
| 2006/0148544 | A1 | 7/2006 | Kim | |
| 2007/0249413 | A1* | 10/2007 | Kim et al. | 455/575.7 |
| 2008/0158800 | A1* | 7/2008 | Aoyagi | 361/681 |
| 2008/0174127 | A1* | 7/2008 | Kim et al. | 292/251.5 |
| 2008/0174392 | A1* | 7/2008 | Cho | 335/285 |
| 2009/0103261 | A1* | 4/2009 | Shih | 361/679.58 |
| 2010/0207903 | A1* | 8/2010 | Kim et al. | 345/173 |
| 2010/0238620 | A1* | 9/2010 | Fish | 361/679.09 |
| 2013/0016460 | A1* | 1/2013 | Yeh et al. | 361/679.01 |
| 2013/0286551 | A1* | 10/2013 | Ashcraft et al. | 361/679.01 |
| 2013/0329359 | A1* | 12/2013 | Andre et al. | 361/679.55 |

FOREIGN PATENT DOCUMENTS

| | | |
|---|---|---|
| EP | 0454120 | 10/1991 |
| EP | 2328058 | 6/2011 |
| JP | 07-183669 | 7/1995 |

OTHER PUBLICATIONS

Extended European Search Report dated Dec. 5, 2013 issued in EP Application No. 13170161.7.

* cited by examiner

*Primary Examiner* — Lisa Lea Edmonds
(74) *Attorney, Agent, or Firm* — Staas & Halsey LLP

(57) ABSTRACT

A portable electronic apparatus includes a main body having a top surface on which a keypad is exposed and a bottom surface disposed opposite to the top surface, a display unit disposed to be hinge-connected to the main body to rotate 360 degrees, and having a front surface to display images and a rear surface disposed opposite to the top surface, and a position fixing unit to fix the main body and the display unit at a first position where the top surface of the main body and the front surface of the display unit are in contact with each other and at a second position where the bottom surface of the main body and the rear surface of the display unit are in contact with each other by using a magnetic force.

20 Claims, 15 Drawing Sheets

PORTABLE ELECTRONIC APPARATUS

CROSS-REFERENCE TO RELATED APPLICATIONS

This application claims priority under 35 U.S.C. §119(a) from Korean Patent Application No. 2012-0086791 filed Aug. 8, 2012 in the Korean Intellectual Property Office, the disclosure of which is incorporated herein by reference in its entirety.

BACKGROUND OF THE INVENTION

1. Field of the Invention

The present disclosure relates to a portable electronic apparatus. More particularly, the present disclosure relates to a portable electronic apparatus that can perform a 360 degree rotation operation.

2. Description of the Related Art

Generally, a laptop personal computer (PC) includes a main body having a keypad, etc. and a display unit having a display panel, and the main body and the display unit are foldably connected to each other through a hinge unit. In recent years, as tablet PCs, smart phones, and the like using a touch screen are popularized, laptop PCs having various functions have emerged.

Reflecting these trends, the laptop PCs that include a touch screen like the tablet PC are being released. The laptop PCs including the touch screen can support a tablet mode as well as a normal clamshell mode. Also, laptop PCs rotatable 360 degrees as well as laptop PCs rotatable within 180 degrees have been released. Here, the laptop PCs rotatable 360 degrees generally includes the tablet mode.

In the normal laptop PCs rotatable 180 degrees, when they are kept or carried, a display unit is closed, that is, in a state that a front surface of the display unit and a top surface of a main body are in contact with each other (an angle between the display unit and the main body is 0 degree), the display unit and the main body are fixed to each other by a detent of the hinge unit. However, in the laptop PCs rotatable 360 degrees, the display unit and the main body may not maintain but can be released from a 360 degree rotation state by using the detent of the hinge unit. Also, the detent of the hinge unit may not enough to provide a 360 degree rotation operation of the display unit.

Accordingly, in the laptop PCs rotatable 360 degrees, a way to fix the display unit and the main body in a 360 degree state as well as in a 0 degree state is required.

SUMMARY OF THE INVENTION

The present general inventive concept provides a portable electronic apparatus including a display unit and a main body that can be rotated 360 degrees with respect to each other and can be fixed to each other in states of 0 degree and 360 degrees.

Additional features and utilities of the present general inventive concept will be set forth in part in the description which follows and, in part, will be obvious from the description, or may be learned by practice of the general inventive concept.

The foregoing and other features and utilities of the present general inventive concept can substantially be achieved by providing a portable electronic apparatus which may include a main body having a top surface on which a keypad is exposed and a bottom surface disposed opposite to the top surface, a display unit that is hinge-connected to the main body to rotate 360 degrees, and includes a front surface to display images and a rear surface disposed opposite to the top surface, and a position fixing unit that fixes the main body and the display unit at a first position where the top surface of the main body and the front surface of the display unit are in contact with each other and at a second position where the bottom surface of the main body and the rear surface of the display unit are in contact with each other by using a magnetic force.

The position fixing unit may include a first fixing unit provided to the display unit; and a second fixing unit provided to the main body.

The first fixing unit may include at least one display fixing member; and the second fixing unit may include at least one first main body fixing member and at least one second main body fixing member, and wherein at the first position, the display fixing member and the first main body fixing member attract each other, and at the second position, the display fixing member and the second main body fixing member attract each other.

The display fixing member may be formed to extend so that one side of the display fixing member is placed adjacent to the front surface of the display unit and the other side of the display fixing member is placed adjacent to the rear surface of the display unit, the first main body fixing member may be placed adjacent to the top surface of the main body; and the second main body fixing member may be placed adjacent to the bottom surface of the main body.

The display fixing member may be implemented as a magnet, and the first main body fixing member and the second main body fixing member may be implemented as a magnetic body.

The display fixing member may be implemented as a magnetic body, and the first main body fixing member and the second main body fixing member may be implemented as a magnet.

The first fixing unit may include at least one first display fixing member, and at least one second display fixing member; and the second fixing unit may include at least one main body fixing member, and wherein at the first position, the first display fixing member and the main body fixing member attract each other, and at the second position, the second display fixing member and the main body fixing member attract each other.

The first display fixing member may be placed adjacent to the front surface of the display unit, the second display fixing member may be placed adjacent to the rear surface of the display unit, and the main body fixing member may be formed to extend so that one side of the main body fixing member is placed adjacent to the top surface of the main body, and the other side of the main body fixing member is placed adjacent to the bottom surface of the main body.

The main body fixing member may be implemented as a magnet, and the first display fixing member and the second display fixing member may be implemented as a magnetic body.

The main body fixing member may be implemented as a magnetic body, and the first display fixing member and the second display fixing member may be implemented as a magnet.

The first fixing unit may include at least one display fixing member; and the second fixing unit may include at least one main body fixing member, and wherein the display fixing member and the main body fixing member attract each other at each of the first position and the second position.

The display fixing member may be formed to extend so that one side of the display fixing member is placed adjacent to the front surface of the display unit, and the other side of the display fixing member is placed adjacent to the rear surface of the display unit, and the main body fixing member may be formed to extend so that one side of the main body fixing member is placed adjacent to the top surface of the main body, and the other side of the main body fixing member is placed adjacent to the bottom surface of the main body.

The display fixing member may be implemented as a magnet, and the main body fixing member may be implemented as a magnetic body.

The display fixing member may be implemented as a magnetic body, and the main body fixing member may be implemented as a magnet.

The first fixing unit may include at least one first display fixing member, and at least one second display fixing member; and the second fixing unit may include at least one first main body fixing member, and at least one second main body fixing member, and wherein at the first position, the first display fixing member and the first main body fixing member attract each other, and at the second position, the second display fixing member and the second main body fixing member attract each other.

The first display fixing member may be placed adjacent to the front surface of the display unit, the second display fixing member may be placed adjacent to the rear surface of the display unit, the first main body fixing member may be placed adjacent to the top surface of the main body, and the second main body fixing member may be placed adjacent to the bottom surface of the main body.

The first display fixing member and the second display fixing member may be implemented as a magnet, and the first main body fixing member and the second main body fixing member may be implemented as a magnetic body.

The first display fixing member and the second display fixing member may be implemented as a magnetic body, and the first main body fixing member and the second main body fixing member may be implemented as a magnet.

The first display fixing member and the second main body fixing member may be implemented as a magnet, and the second display fixing member and the first main body fixing member may be implemented as a magnetic body.

The first display fixing member and the second main body fixing member may be implemented as a magnetic body, and the second display fixing member and the first main body fixing member may be implemented as a magnet.

The portable electronic apparatus may include a detecting sensor that is provided in at least one of the main body and the display unit, and detects a magnetic field of the position fixing unit; and a control unit that is provided in the main body, and controls operation of the portable electronic apparatus, wherein when the detecting sensor detects the magnetic field, the control unit controls the portable electronic apparatus to perform at least one of turning off the keypad, mirroring with other display apparatus, and pre-set applications.

The portable electronic apparatus may include a locking switch that is provided in at least one of the main body and the display unit, and a control unit that controls the position fixing unit depending on operation of the locking switch, wherein the position fixing unit comprises an electromagnet, and the control unit adjusts a magnetic force of the electromagnet depending on the on/off of the locking switch.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
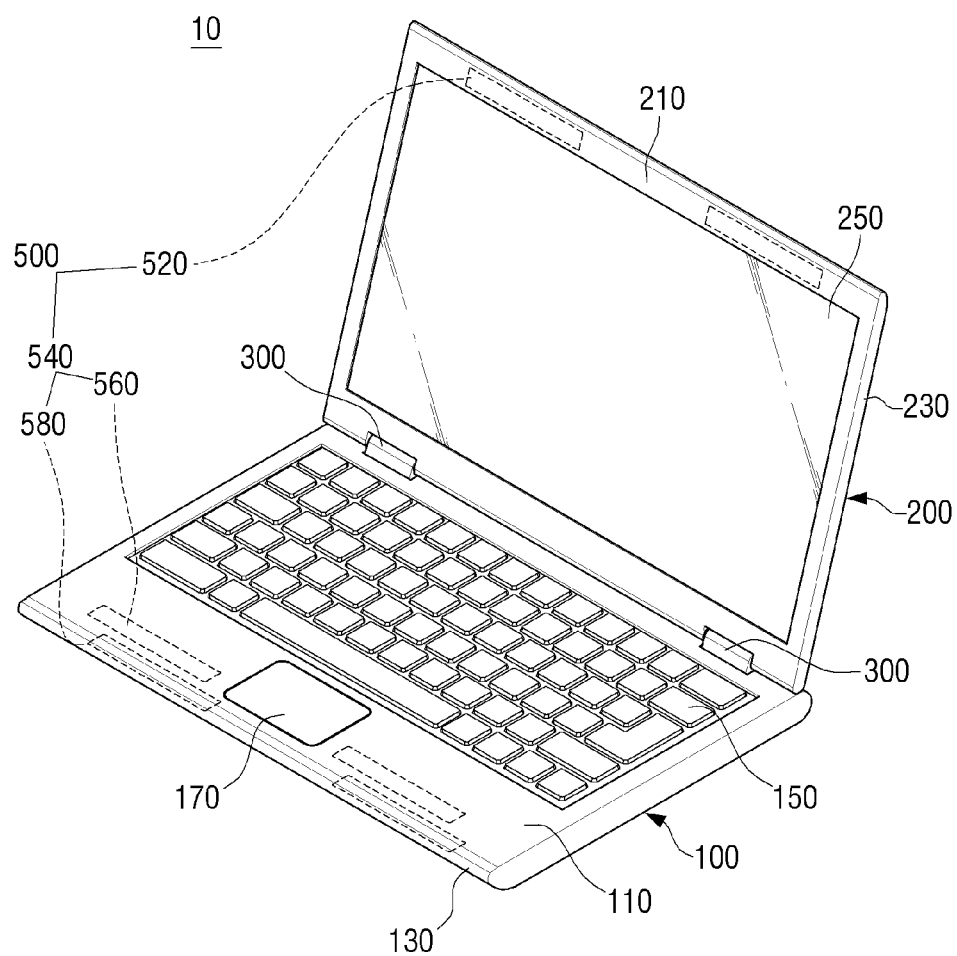
FIG. 1 is a perspective view schematically illustrating a portable electronic apparatus according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

The matters defined herein, such as a detailed construction and elements thereof, are provided to assist in a comprehensive understanding of this description. Thus, it is apparent that exemplary embodiments may be carried out without those defined matters. Also, well-known functions or constructions are omitted to provide a clear and concise description of exemplary embodiments. Further, dimensions of various elements in the accompanying drawings may be arbitrarily increased or decreased for assisting in a comprehensive understanding.

Figure 2:
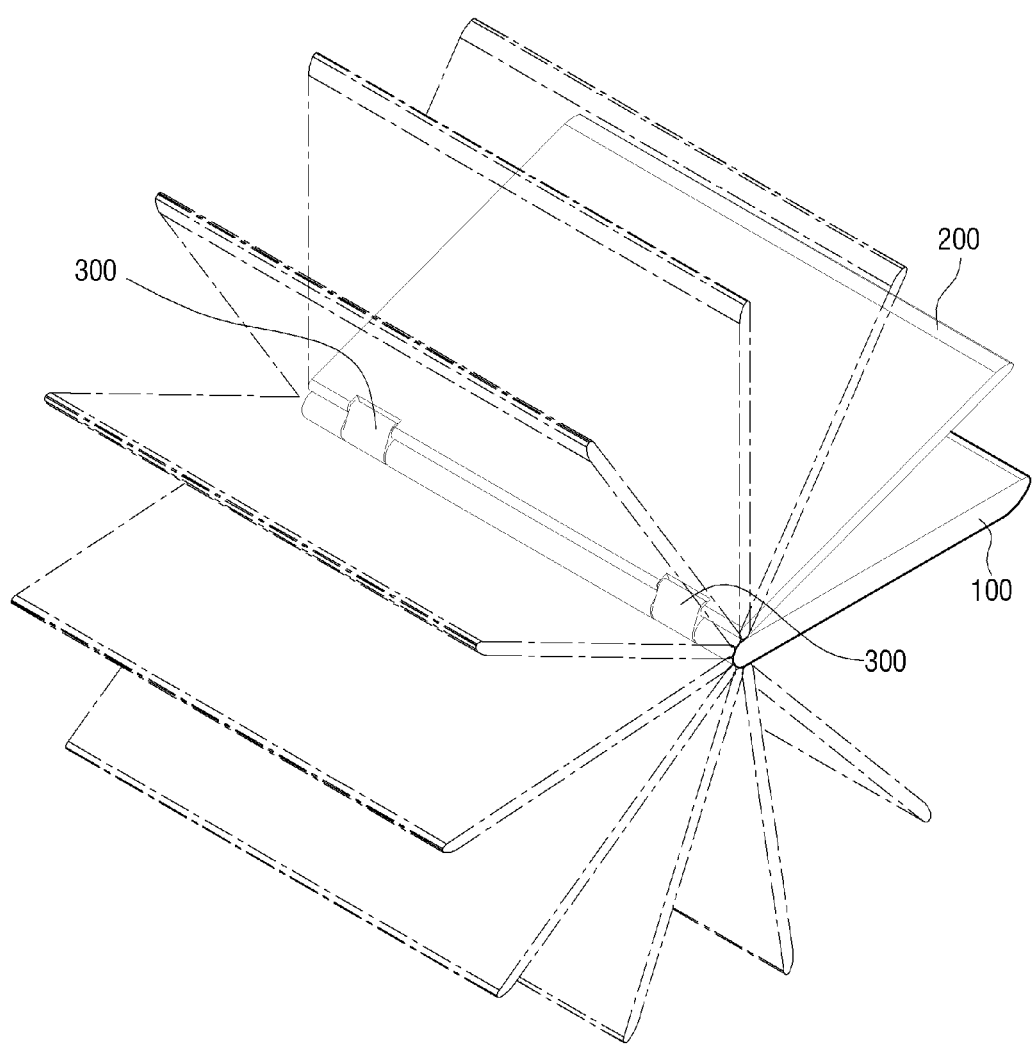
FIG. 2 is a perspective view schematically illustrating 360 degree rotation operation of the portable electronic apparatus of FIG. 1.

FIG. 1 is a perspective view schematically illustrating a portable electronic apparatus 10 according to an embodiment of the present general inventive concept, and FIG. 2 is a perspective view schematically illustrating a 360 degree rotation operation of the portable electronic apparatus 10 of FIG. 1.

Referring to FIG. 1, the portable electronic apparatus 10 includes a main body 100, a display unit 200, one or more hinge units 300, and a position fixing unit 500.

The portable electronic apparatus 10 may be various portable devices such as a laptop personal computer (PC), a tablet PC, a smart phone, etc. However, in the present embodiment, the portable electronic apparatus 10 will be a laptop PC with a tablet mode.

The main body 100 includes a top housing 110, a bottom housing 130, a keypad 150, a touch pad 170, and a control unit (not illustrated).

The top housing 110 and the bottom housing 130 are connected to each other and may provide a space to accommodate various electronic components (not illustrated).

The keypad 150 is mounted on a top surface of the top housing 110. The keypad 150 includes buttons such as letters, numbers, symbols, direction indicators, etc. A user presses the buttons to perform desired tasks. The keypad 150 may be a conventional keypad. However, the present general inventive concept is not limited thereto. The keypad 150 may be a QWERTY keyboard unit or other type keypad or keyboard unit to input user data to the electronic apparatus 10.

The touch pad 170 is mounted on the top surface of the top housing 110. The touch pad 170 is used as a substitute for a mouse in the laptop PC. The touch pad 170 may be a conventional touch pad. However, the present general inventive concept is not limited thereto. The touch pad 170 may be a touch panel or other type pad or panel unit to input a user command to the electronic apparatus 10.

The control unit (not illustrated) controls components of the portable electronic apparatus 10 to perform operations and functions thereof. In the present embodiment, since the portable electronic apparatus 10 supports a tablet mode in which it can be used like a tablet PC in addition to functions of the normal laptop PC, the control unit (not illustrated) controls a clamshell mode in which the laptop PC can be used like a normal laptop PC and the tablet mode in which the laptop PC can be used like a tablet PC.

The display unit 200 includes a front housing 210, a rear housing 230, and a display panel 250. The display unit 200 may have components to perform a function thereof independently of the main body 100 or to perform a function thereof associated with the main body 100.

The front housing 210 and the rear housing 230 are connected to each other and may provide a space to accommodate the display panel 250.

The display panel 250 is a component to display images. In the present embodiment, the display unit 200 may be implemented as a touch panel capable of supporting the tablet mode. The touch panel may be capacitive or resistive one. A conventional touch panel can be used as the touch panel of the display unit 200. However, the present general inventive concept is not limited thereto. The display panel 250 may be a structure to display an image and to receive user input data and command according to an operation of the electronic apparatus 10.

The hinge units 300 are disposed between the main body 100 and the display unit 200. The hinge units 300, as illustrated in FIG. 2, allows the main body 100 and the display unit 200 to rotate with respect to each other by one angle of a range of about 0° to about 360°. The hinge units 300 may be formed in various structures as long as they allows the main body 100 and the display unit 200 to rotate with respect to each other within a range of about 0° to about 360°. Also, the hinge units 300 may have a free-stop function, and thus can fix the display unit 200 at a desired angle within the range of about 0° to about 360°. The hinge units 300 allow the main body 100 and the display unit 200 to be folded with respect to each other at about 0° and at about 360°.

The position fixing unit 500 fixes the main body 100 and the display unit 200 at about 0° and at about 360°. In other words, the position fixing unit 500 fixes the main body 100 and the display unit 200 at one of a position of about 0°, that is, a position where the top surface of the main body 100 and the front surface of the display unit 200 are disposed to face each other or in contact with each other and a position of about 360°, that is, a position where a bottom surface of the main body 100 and a rear surface of the display unit 200 are disposed to face each other or in contact with each other.

The position fixing unit 500 includes a first fixing unit 520 provided to the display unit 200 and a second fixing unit 540 provided to the main body 100. The second fixing unit 540 includes a first main body fixing member 560 and a second main body fixing member 580.

Figure 3:
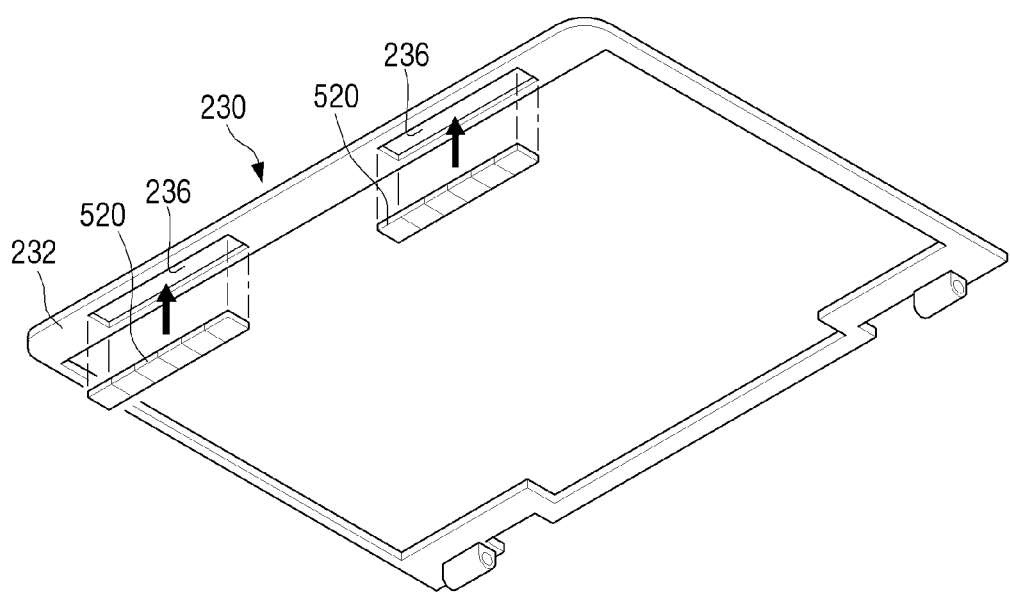
FIG. 3 is a perspective view schematically illustrating an inner surface of a rear housing provided to a display unit of the portable electronic apparatus of FIG. 1.

FIG. 3 is a perspective view schematically illustrating an inner surface 232 of the rear housing 230 provided to the display unit 200 of the portable electronic apparatus 10 of FIG. 1.

Referring to FIG. 3, the first fixing unit 520 is disposed on the inner surface 232 of the rear housing 230. The first fixing unit 520 includes one or more display fixing members 520. The present embodiment illustrates two display fixing members 520, as an example.

Figure 7:
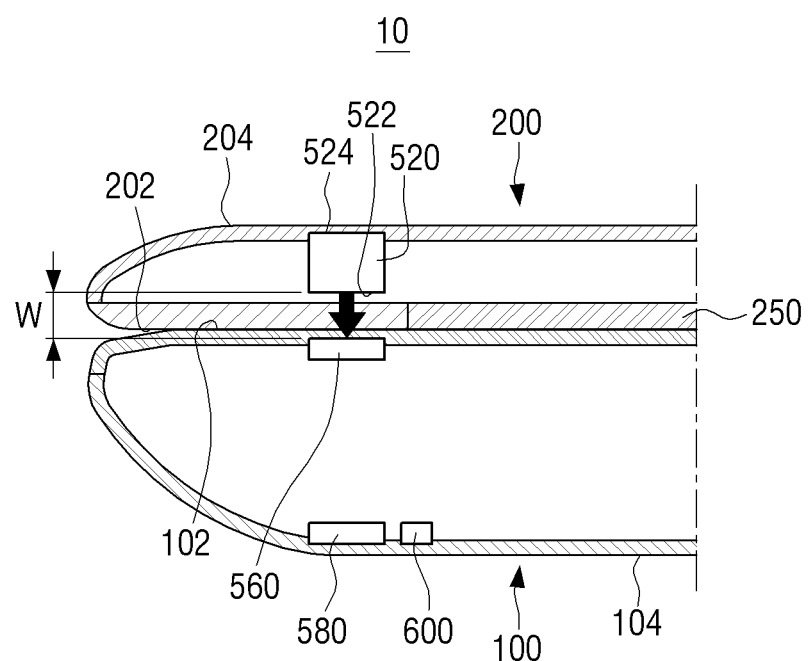
FIG. 7 is a partially sectional view schematically illustrating an A portion of FIG. 6.

The display fixing members 520 are mounted in receiving grooves 236 formed on the inner surface 232 of the rear housing 230, respectively. Each of the display fixing members 520 is mounted in the receiving groove 236 and is processed by bonding, thereby being fixed to the inner surface 232 of the rear housing 230. Then, the display fixing member 520, as illustrated in FIG. 7, is formed to extend so that one side 522 thereof is arranged adjacent to the front surface 202 of the display unit 200 and the other side 524 thereof is arranged adjacent to the rear surface 204 of the display unit 200. It is possible that the display fixing member may be disposed on an inner surface of the front housing 210 rather than the rear housing 230.

The display fixing member 520 may be implemented as a magnet. Each of the display fixing members 520 is formed to connect six magnets in series. The six magnets are mounted in the single receiving groove 236. A size of each of the magnets may be about 4 mm (horizontal width)×about 3 mm (vertical width)×about 10 mm (length), for example, and a size or amount of a magnetic force thereof may be about 3600 G, for example. However, the present general inventive concept is not limited thereto. The number, the size, and the amount of magnetic force of the magnet may be properly changed depending on a design or user preference. Also, the magnet may use a multi-poles magnet as well as a single-pole magnet. An electromagnet may be provided as the magnet.

Figure 4:
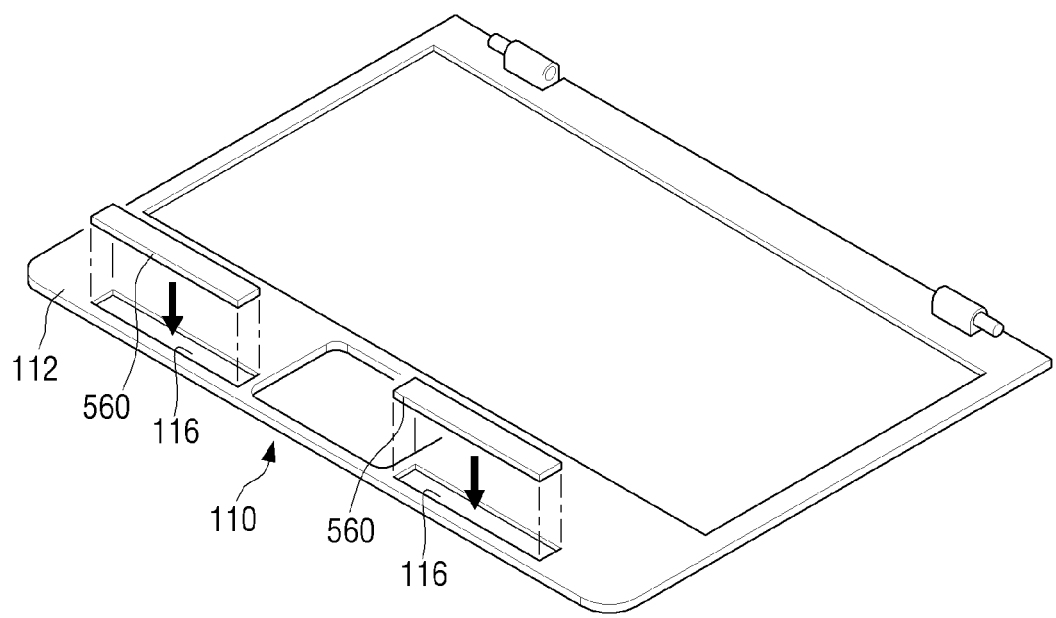
FIG. 4 is a perspective view schematically illustrating an inner surface of a top housing provided to a main body of the portable electronic apparatus of FIG. 1.
Figure 5:
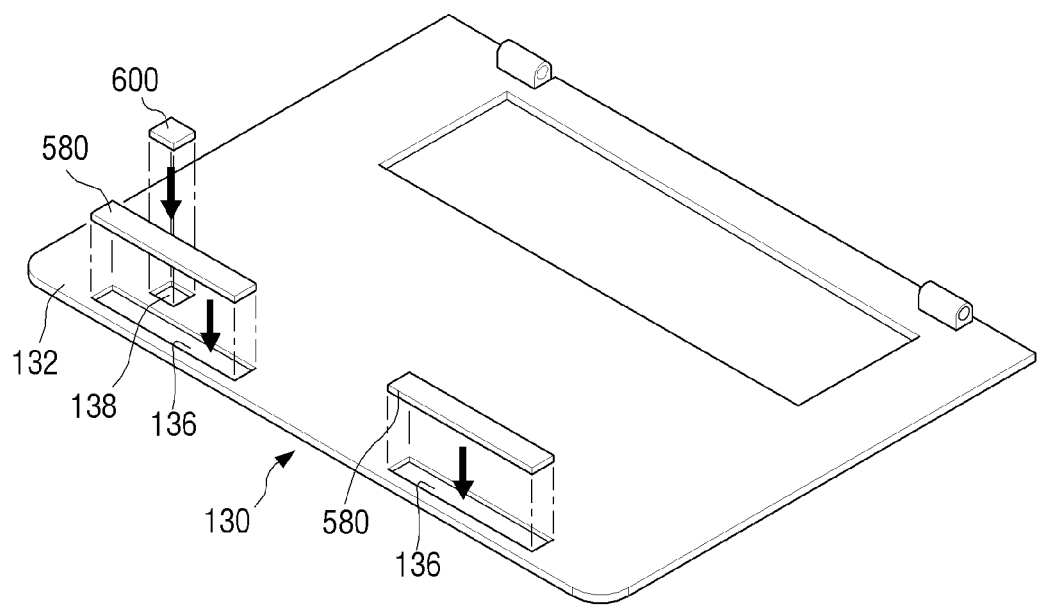
FIG. 5 is a perspective view schematically illustrating an inner surface of a bottom housing provided to a main body of the portable electronic apparatus of FIG. 1.

FIG. 4 is a perspective view schematically illustrating an inner surface 112 of the top housing 110 provided to the main body 100 of the portable electronic apparatus 10 of FIG. 1, and FIG. 5 is a perspective view schematically illustrating an inner surface 132 of the bottom housing 130 provided to the main body 100 of the portable electronic apparatus 10 of FIG. 1.

Referring to FIG. 4, on an inner surface 112 of the top housing 110 is mounted the first main body fixing member 560 of the second fixing unit 540 (see FIG. 1). At least one first main body fixing member 560 may be provided. In the present embodiment, it is disclosed that two main body fixing members 560 are limited to be provided.

The first main body fixing members 560 are mounted in receiving grooves 116 formed on the inner surface 112 of the top housing 110, respectively. Each of the first main body fixing members 560 is mounted in the receiving groove 116 and is processed by bonding, thereby being fixed to the inner surface 112 of the top housing 110.

The first main body fixing member 560 may be implemented as a magnetic body. In the present embodiment, it will be disclosed that the first main body fixing member 560 is limited to a galvanized steel plate. This is only one example; therefore, the first main body fixing member 560 may use various things as long as they are magnetic bodies. Each of the first main body fixing members 560 may have a size of about 5.2 mm (horizontal width)×about 1 mm (vertical width)×about 60 mm (length), for example. This is only one example; therefore, the size of the first main body fixing member 560 may be properly changed depending on the design thereof.

Referring to FIG. 5, the second main body fixing member 580 of the second fixing unit 540 (see FIG. 1) is disposed on the inner surface 132 of the bottom housing 130. At least one second main body fixing member 580 may be provided. In the present embodiment, two second main body fixing members 580 are provided as an example.

The second main body fixing members 580 are mounted in receiving grooves 136 formed on the inner surface 132 of the bottom housing 130, respectively. Each of the second main body fixing members 580 is mounted in the receiving groove 136 and is processed by bonding, thereby being fixed to the inner surface 132 of the bottom housing 130.

The second main body fixing member 580 may be implemented as a magnetic body like the first main body fixing member 560. In the present embodiment, it will be disclosed that the second main body fixing member 580 is limited to a galvanized steel plate. Each of the second main body fixing members 580 may have a size of about 5.2 mm (horizontal width)×about 1 mm (vertical width)×about 60 mm (length) as the same as that of the first main body fixing member 560. The size of the second main body fixing member 580 is also only one example; therefore, the size thereof may be properly changed depending on the design thereof.

Referring to FIG. 5, a detecting sensor 600 is provided above the second main body fixing member 580 on the left of the inner surface 132 of the bottom housing 130. The detecting sensor 600 is mounted in a detecting sensor receiving groove 138, and thus is processed by bonding, thereby being fixed to the inner surface 132 of the bottom housing 130. The detecting sensor 600 detects a magnetic field of the display fixing member 520. The detecting sensor 600 will be described in detail later. On the other hand, the mounting position of the detecting sensor 600 as illustrated in FIG. 5 is only one example; therefore, the detecting sensor 600 may be mounted on various other positions of the bottom housing 130 as long as it can detect the magnetic field of the display fixing member 520.

Figure 6:
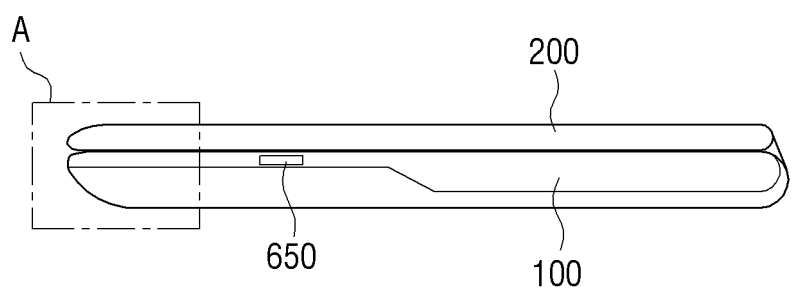
FIG. 6 is a perspective view schematically illustrating the portable electronic apparatus of FIG. 1 that is closed in a clamshell mode.

FIG. 6 is a perspective view schematically illustrating the portable electronic apparatus 10 of FIG. 1 that is closed in a clamshell mode, and FIG. 7 is a partially sectional view schematically illustrating an A portion of FIG. 6.

Referring to FIG. 6, the portable electronic apparatus 10 is closed in a general clamshell mode. When the portable electronic apparatus 10 is not used or is carried out, as illustrated in FIG. 6, a user allows the top surface 102 of the main body 100 and the front surface 202 of the display unit 200 to face each other or be in contact with each other so that the main body 100 and the display unit 200 are folded with respect to each other.

Referring to FIG. 7, in the clamshell mode, when the top surface 102 of the main body 100 is disposed to face or in contact with the front surface 202 of the display unit 200, the display fixing member 520 and the first main body fixing member 560 are placed adjacent to each other. Here, a distance W of FIG. 7 between the display fixing member 520 and the first main body fixing member 560 is determined so that a magnetic field (arrow) of the display fixing member 520 can reach the first main body fixing member 560. In the present embodiment, the distance W between the display fixing member 520 and the first main body fixing member 560 is about 2.64 mm, for example. However, the present general inventive concept is not limited thereto. It is possible that the distance between the display fixing member and the first main body fixing member may be properly changed depending on the size of the magnetic force of the display fixing member.

A force, for example an attraction force may be generated between the first main body fixing member 560 and the display fixing member 520 such that the top surface 102 of the main body 100 and the front surface 202 of the display unit 200 is not separated from and is fixed to each other. In the portable electronic apparatus 10 according to the present embodiment, when the display unit 200 is closed in the clamshell mode, the main body 100 and the display unit 200 may be stably fixed to each other through the display fixing member 520 and the first main body fixing member 560.

As illustrated in FIG. 6, the portable electronic apparatus 10 may have a locking switch 650 on a side surface 106 of the main body 100 thereof. The locking switch 650 may lock or unlock the display unit 200 with respect to the main body 100 in a position where the front surface 202 of the display unit 200 and the top surface of the main body 100 are disposed to face or in contact with each other as illustrated in FIG. 6 or in a position where the rear surface 204 of the display unit 200 and the bottom surface of the main body 100 are disposed to face each other or in contact with each other as illustrated in FIG. 8.

The locking switch 650 may be provided when the display fixing member 520 is an electromagnet. In this case, depending on on/off of the locking switch 650, the portable electronic apparatus 10 can adjust the magnetic force of the electromagnet through the control unit (not illustrated) so as to lock or unlock the display unit 200 with respect to the main body 100.

Figure 8:
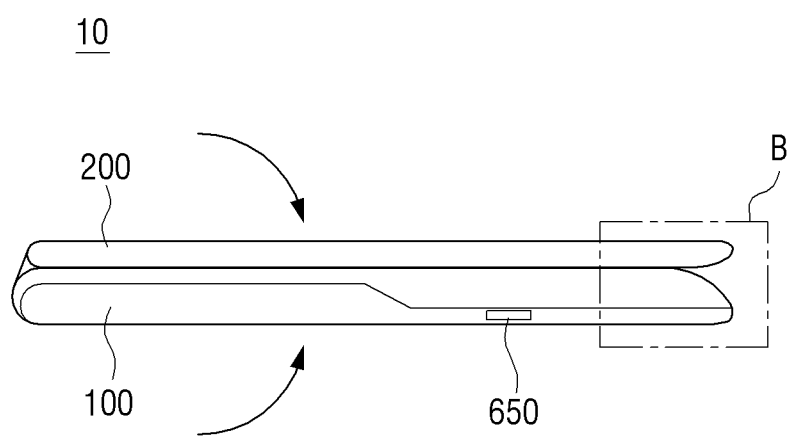
FIG. 8 is a perspective view schematically illustrating the portable electronic apparatus of FIG. 1 in a tablet mode.
Figure 9:
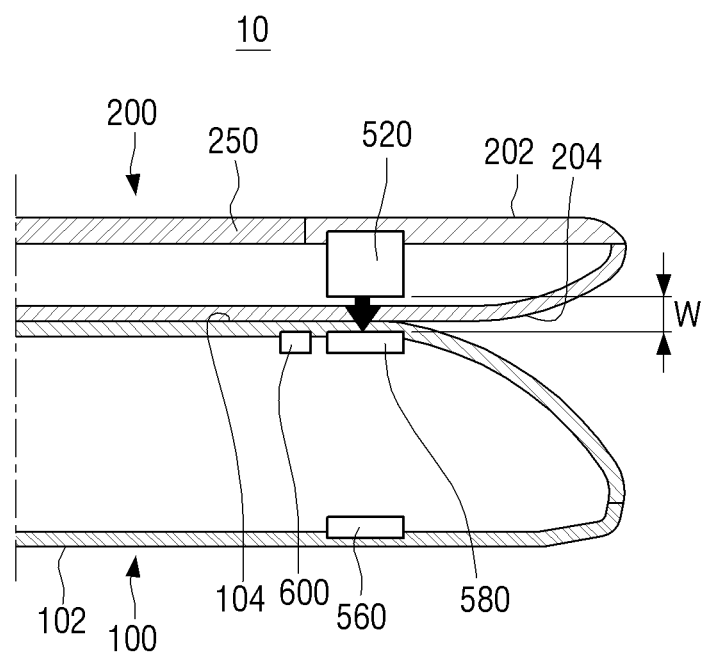
FIG. 9 is a partially sectional view schematically illustrating a B portion of FIG. 8.

FIG. 8 is a perspective view schematically illustrating the portable electronic apparatus 10 of FIG. 1 in a tablet mode, and FIG. 9 is a partially sectional view schematically illustrating a B portion of FIG. 8.

Referring to FIG. 8, the portable electronic apparatus 10 is in a tablet mode. When converting the portable electronic apparatus 10 into the tablet mode, the user rotates the main body 100 and the display unit 200 in arrow directions on an axis of the hinge units 300 (see FIG. 1), and causes the bottom surface of the main body 100 and the rear surface of the display unit 200 to be in contact with each other so as to fold the main body 100 and the display unit 200 with respect to each other.

Referring to FIG. 9, in the tablet mode, when the bottom surface 104 of the main body 100 is in contact with the rear surface 204 of the display unit 200, the display fixing member 520 and the second main body fixing member 580 are placed adjacent to each other. Here, a distance W between the display fixing member 520 and the second main body fixing member 580 is determined so that the magnetic field (arrow) of the display fixing member 520 can reach the second main body fixing member 580. The distance W between the display fixing member 520 and the second main body fixing member 580 may be about 2.64 mm as the same as that between display unit 200 and the first main body fixing member 560. This is also only one example; therefore, the distance W between the display fixing member 520 and the second main body fixing member 580 may be properly changed depending on the size of the magnetic force of the display fixing member 520.

A force, for example, an attraction force, for example, may be formed between the second main body fixing member 580 and the display fixing member 520 such that the bottom surface 104 of the main body 100 and the rear surface 204 of the display unit 200 is not separated from and is fixed to each other. When the portable electronic apparatus 10 according to the present embodiment is implemented in the tablet mode, the main body 100 and the display unit 200 may be stably fixed to each other through the display fixing member 520 and the second main body fixing member 580.

It is possible that the keypad 150 (see FIG. 1) and touch pad 170 (see FIG. 1) are disposed on the top surface 102 of the main body 100. In the tablet mode, since the top surface 102 of the main body 100 usually acts as a stand, it can be fixedly disposed somewhere. At this time, the keypad 150 and touch pad 170 of the portable electronic apparatus 10 may be operated, and thus an unintended operation may be performed on the display panel 250.

For preventing this, the portable electronic apparatus 10 according to the present embodiment, when being converted into the tablet mode, turns off the keypad 150 and touch pad 170. For example, when the detecting sensor 600 detects the magnetic field of the display fixing member 520, the control unit (not illustrated) turns off the keypad 150 and touch pad 170. As a result, the portable electronic apparatus 10 according to the present embodiment, in the tablet mode, can prevent unwanted operations of the keypad 150 and touch pad 170 (see FIG. 1).

In addition, when the detecting sensor 600 detects the magnetic field of the display fixing member 520, the control unit (not illustrated) may execute a variety of programs that are pre-set by the user. For example, when the detecting sensor 600 detects the magnetic field, the control unit (not illustrated) can immediately run mirroring with a television, etc., pre-set applications (for example, an alarm function, a slide show function, a camera function, etc.), etc.

In the embodiments as described above, the first fixing unit 520 of the position fixing unit 500 is the magnet, and the second fixing unit 540 thereof is the magnetic body. However, the first fixing unit 520 may be a magnetic body, and the second fixing unit 540 may be a magnet. Alternatively, both the first fixing unit 520 and the second fixing unit 540 may be a magnet.

Figure 10:
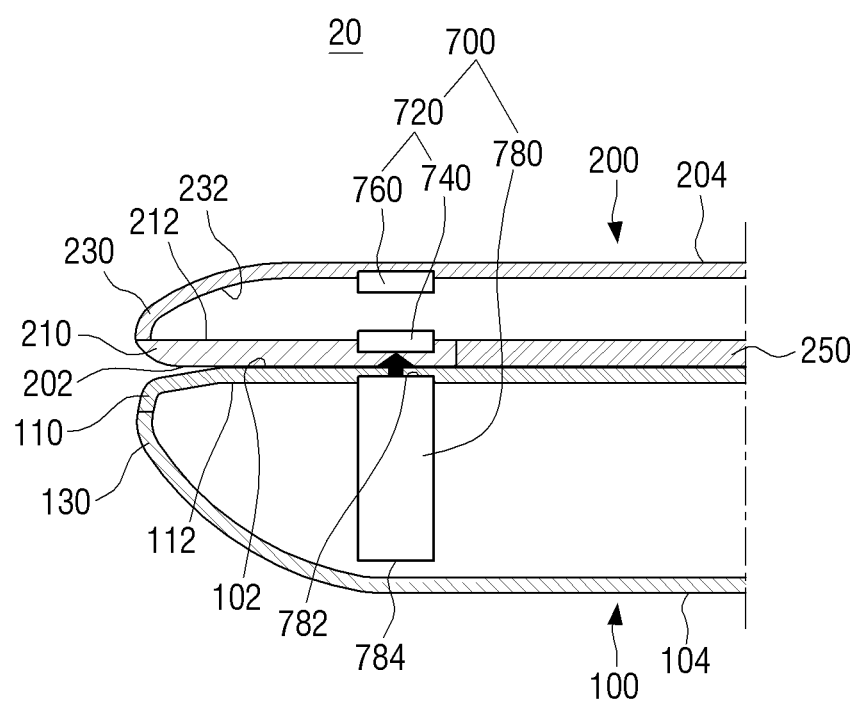
FIG. 10 is a partially sectional view schematically illustrating a portable electronic apparatus in a clamshell mode according to an embodiment of the present general inventive concept.
Figure 11:
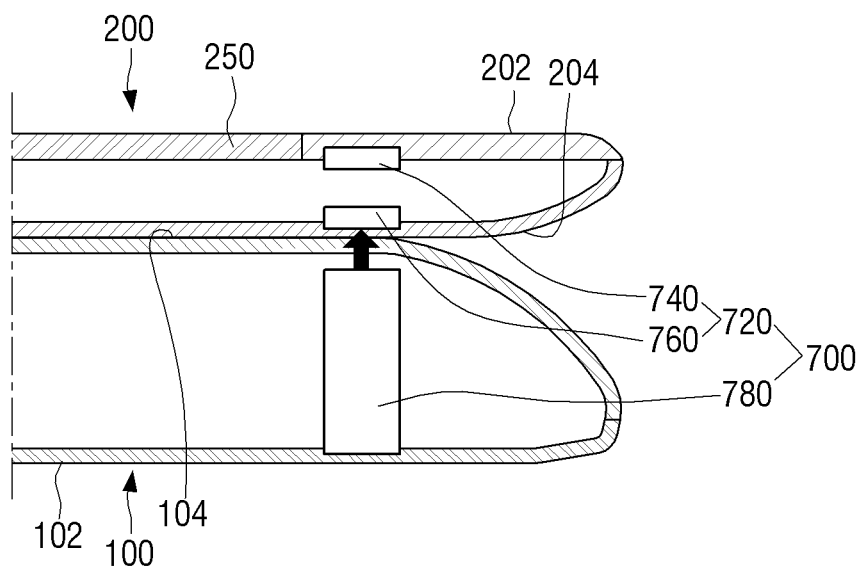
FIG. 11 is a partially sectional view schematically illustrating the portable electronic apparatus of FIG. 10 in a tablet mode according to an embodiment of the present general inventive concept.

FIG. 10 is a partially sectional view schematically illustrating a portable electronic apparatus 20 in a clamshell mode according to an embodiment of the present general inventive concept, and FIG. 11 is a partially sectional view schematically illustrating the portable electronic apparatus 20 in a tablet mode according to an embodiment of the present general inventive concept.

Hereinafter, the portable electronic apparatus 20 according to the embodiment is similar to the electronic apparatus 10 of FIG. 1 except for differences therefrom. Descriptions of the same elements of the portable electronic apparatuses 10 and 20 will be omitted.

Referring to FIGS. 10 and 11, a position fixing unit 700 includes a first fixing unit 720 and a second fixing unit 780.

The first fixing unit 720 includes at least one first display fixing member 740 and at least one second display fixing member 760.

The first display fixing member 740 is mounted on the inner surface 212 of the front housing 210, and thus is placed adjacent to the front surface 202 of the display unit 200. The second display fixing member 760 is mounted on the inner surface 232 of the rear housing 230, and thus is placed adjacent to the rear surface 204 of the display unit 200. The first display fixing member 740 and the second display fixing member 760 are implemented as a magnetic body, respectively, and may be implemented as a galvanized steel plate like the first embodiment.

The second fixing unit 780 includes at least one main body fixing member 780.

The main body fixing member 780 is mounted on the inner surface 112 of the top housing 110, and is formed to extend so that one side 782 thereof is placed adjacent to the top surface 102 of the main body 100, and the other side 784 thereof is placed adjacent to placed adjacent to the bottom surface 104 of the main body 100. Alternatively, the main body fixing member 780 may be mounted on the inner surface of the bottom housing rather than the top housing. The main body fixing member 780 is implemented as a magnet, and may be implemented as a single-pole magnet, a multi-pole magnet, or an electromagnet, etc., like the first embodiment.

An operation of the portable electronic apparatus 20 according to the present embodiment will be disclosed hereinafter.

Referring to FIG. 10, when the display unit 200 is closed in the clamshell mode, the portable electronic apparatus 20 allows the top surface 102 of the main body 100 and the front surface 202 of the display unit 200 to face each other or be in contact with each other. At this time, A force, for example, a magnetic force or an attraction force, is generated or formed between the first display fixing member 740 of the portable electronic apparatus 20 and the main body fixing member 780 thereof due to the magnetic field (arrow) of the main body fixing member 780. As a result, the top surface 102 of the main body 100 and the front surface 202 of the display unit 200 of the portable electronic apparatus 20 are not separated from and kept fixed to each other.

Referring to FIG. 11, when converted into the tablet mode, the bottom surface 104 of the main body 100 and the rear surface 204 of the display unit 200 of the portable electronic apparatus 20 face each other or are in contact with each other. At this time, a force, for example, an attraction force, may be formed between the second display fixing member 760 of the portable electronic apparatus 20 and the main body fixing member 780 thereof due to the magnetic field (arrow) of the main body fixing member 780. As a result, when the portable electronic apparatus 20 is in the tablet mode, the bottom surface 104 of the main body 100 and the rear surface 204 of the display unit 200 of the portable electronic apparatus 20 are not separated from and kept fixed to each other.

Although the present embodiment illustrates that the first fixing unit 720 is the magnetic body, and the second fixing unit 780 is the magnet, it is possible that the first fixing unit may be implemented as a magnet, and the second fixing unit may be implemented as a magnetic body. Alternatively, both the first fixing unit and the second fixing unit may be implemented as a magnet.

Figure 12:
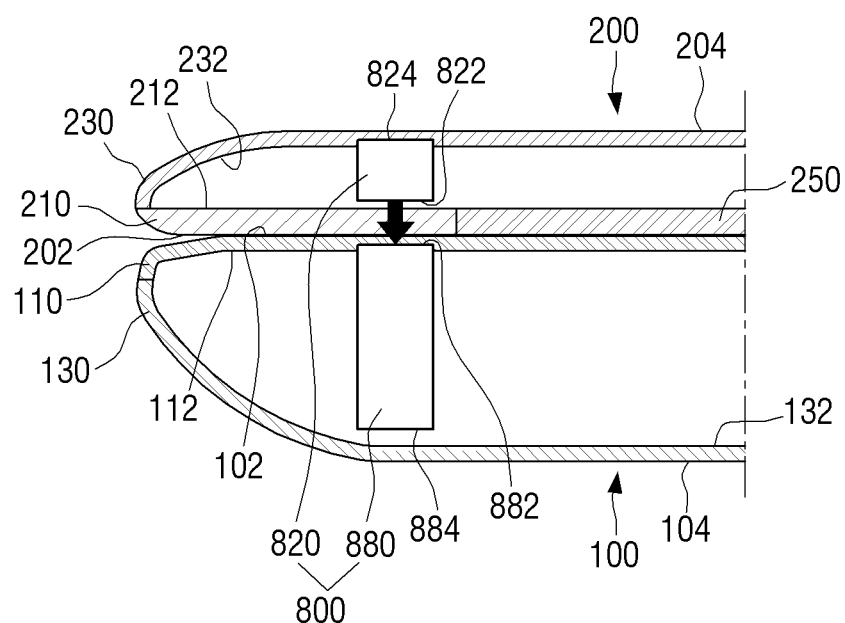
FIG. 12 is a partially sectional view schematically illustrating a portable electronic apparatus in a clamshell mode according to an embodiment of the present general inventive concept.
Figure 13:
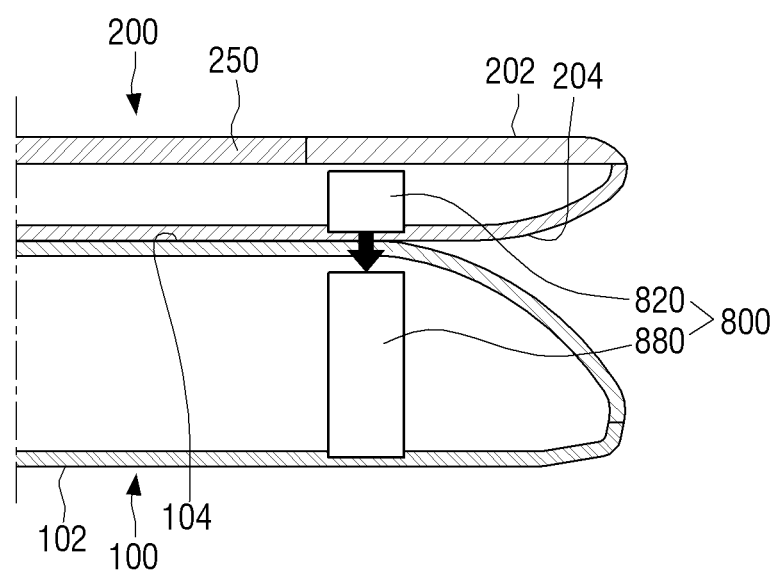
FIG. 13 is a partially sectional view schematically illustrating the portable electronic apparatus of FIG. 12 in a tablet mode according to an embodiment of the present general inventive concept.

FIG. 12 is a partially sectional view schematically illustrating a portable electronic apparatus 30 in a clamshell mode according to an embodiment of the present general inventive concept, and FIG. 13 is a partially sectional view schematically illustrating the portable electronic apparatus 30 in a tablet mode according to an embodiment of the present general inventive concept.

Hereinafter, the portable electronic apparatus 30 of FIG. 12 is similar to the portable electronic apparatus 10 of FIG. 1 except for one or more differences. With respect to elements identical to those of the portable electronic apparatus, detail descriptions thereof will be omitted.

Referring to FIGS. 12 and 13, a position fixing unit 800 includes a first fixing unit 820 and a second fixing unit 880.

The first fixing unit 820 includes at least one display fixing member 820. The display fixing member 820 is mounted on the inner surface 232 of the rear housing 230, and is formed to extend so that one side 822 thereof is placed adjacent to the front surface 202 of the display unit 200 and the other side 824 thereof is placed adjacent to the rear surface 204 of the display unit 200. It is possible that the display fixing member 820 may be mounted on the inner surface of the front housing 210 rather than the rear housing 230. The display fixing member 820 is implemented as a magnet, and may be implemented as a single-pole magnet, a multi-pole magnet, or an electromagnet, etc. like that of the embodiment of FIG. 1.

The second fixing unit 880 includes at least one main body fixing member 880. The main body fixing member 880 is mounted on the inner surface 112 of the top housing 110, and is formed to extend so that one side 882 thereof is placed adjacent to the top surface 102 of the main body 100, and the other side 884 thereof is placed adjacent to the bottom surface 104 of the main body 100. It is possible that the main body fixing member 880 may be mounted on the inner surface of the bottom housing 130 rather than the top housing 110. The main body fixing member 880 is implemented as a magnetic body, and may be implemented as a galvanized steel plate like that of the first embodiment.

An operation of the portable electronic apparatus 30 according to the present embodiment will be disclosed hereinafter.

Referring to FIG. 12, when the display unit 200 is closed in the clamshell mode, the portable electronic apparatus 30 allows the top surface 102 of the main body 100 and the front surface 202 of the display unit 200 to be in contact with each other. At this time, the main body fixing member 880 of the portable electronic apparatus 30 is attracted to the display fixing member 820 thereof due to the magnetic field (arrow) of the display fixing member 820. As a result, the top surface 102 of the main body 100 and the front surface 202 of the display unit 200 of the portable electronic apparatus 30 are not separated from and kept fixed to each other.

Referring to FIG. 13, when converted into the tablet mode, the bottom surface 104 of the main body 100 and the rear surface 204 of the display unit 200 of the portable electronic apparatus 30 are in contact with each other. At this time, the main body fixing member 880 of the portable electronic apparatus 30 is attracted to the display fixing member 820 thereof due to the magnetic field (arrow) of the display fixing member 820. As a result, when the portable electronic apparatus 30 is in the tablet mode, the bottom surface 104 of the main body 100 and the rear surface 204 of the display unit 200 of the portable electronic apparatus 30 are not separated from and kept fixed to each other.

Although the present embodiment illustrates that the first fixing unit is a magnet, and the second fixing unit is a magnetic body, it is possible that the first fixing unit may be implemented as a magnetic body, and the second fixing unit may be implemented as a magnet. It is also possible that both the first fixing unit and second fixing unit may be implemented as a magnet.

Figure 14:
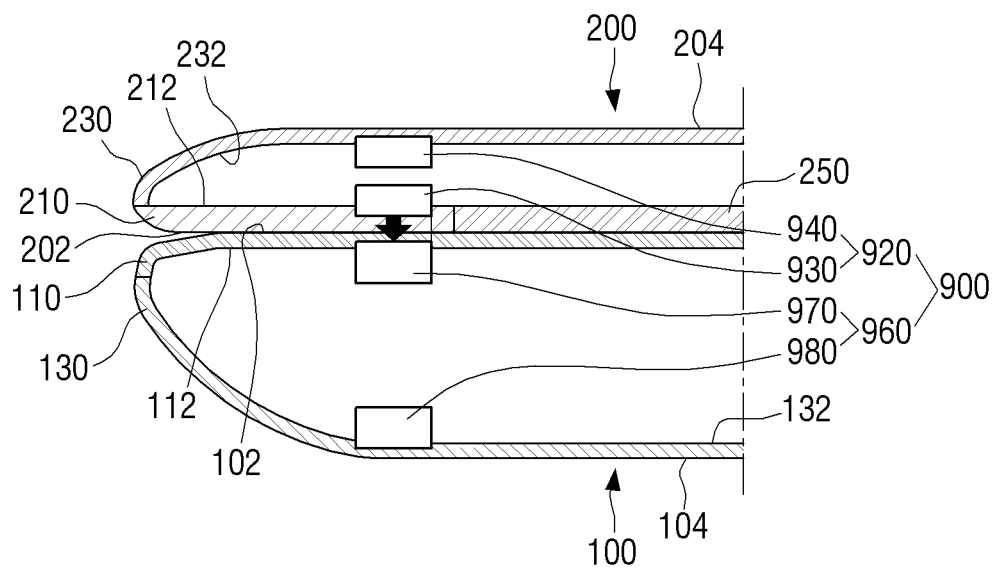
FIG. 14 is a partially sectional view schematically illustrating a portable electronic apparatus in a clamshell mode according to an embodiment of the present general inventive concept.
Figure 15:
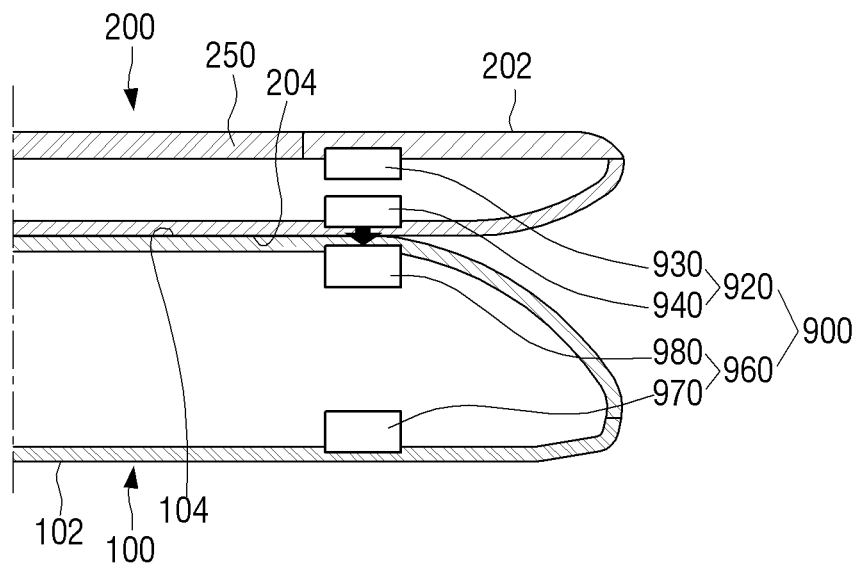
FIG. 15 is a partially sectional view schematically illustrating the portable electronic apparatus of FIG. 4 in a tablet mode according to an embodiment of the present general inventive concept.

FIG. 14 is a partially sectional view schematically illustrating a portable electronic apparatus 40 in a clamshell mode according to an embodiment of the present general inventive concept, and FIG. 15 is a partially sectional view schematically illustrating the portable electronic apparatus 40 in a tablet mode according to an embodiment of the present general inventive concept.

Hereinafter, the portable electronic apparatus 40 is similar to the electronic apparatus 10 of FIG. 1 except for one or more differences. With respect to elements identical to those of the portable electronic apparatus, descriptions thereof will be omitted.

Referring to FIGS. 14 and 15, a position fixing unit 900 includes a first fixing unit 920 and a second fixing unit 960.

The first fixing unit 920 includes at least one first display fixing member 930 and at least one second display fixing member 940.

The first display fixing member 930 is mounted on the inner surface 212 of the front housing 210, and thus is placed adjacent to the front surface 202 of the display unit 200. The second display fixing member 940 is mounted on the inner surface 232 of the rear housing 230, and thus is placed adjacent to the rear surface 204 of the display unit 200. The first display fixing member 930 and the second display fixing member 940 are implemented as a magnet, respectively, and may be implemented as a single-pole magnet, a multi-pole magnet, or an electromagnet, etc. like that of the first embodiment.

The second fixing unit 960 includes at least one first main body fixing member 970 and at least one second main body fixing member 980.

The first main body fixing member 970 is mounted on the inner surface 112 of the top housing 110, and is placed adjacent to the top surface 102 of the main body 100. The second main body fixing member 980 is mounted on the inner surface 132 of the bottom housing 130, and is placed adjacent to the bottom surface 104 of the main body 100. The first main body fixing member 970 and the second main body fixing member 980 are implemented as a magnet, and may be implemented as a galvanized steel plate like that of the first embodiment.

An operation of the portable electronic apparatus 40 according to the present embodiment will be disclosed hereinafter.

Referring to FIG. 14, when the display unit 200 is closed in the clamshell mode, the portable electronic apparatus 40 allows the top surface 102 of the main body 100 and the front surface 202 of the display unit 200 to be in contact with each other. At this time, the first main body fixing member 970 of the portable electronic apparatus 40 is attracted to the first display fixing member 930 thereof due to the magnetic field (arrow) of the first display fixing member 930. As a result, the top surface 102 of the main body 100 and the front surface 202 of the display unit 200 of the portable electronic apparatus 40 are not separated from and kept fixed to each other.

Referring to FIG. 15, when converted into the tablet mode, the bottom surface 104 of the main body 100 and the rear surface 204 of the display unit 200 of the portable electronic apparatus 40 are in contact with each other. At this time, the second main body fixing member 980 of the portable electronic apparatus 40 is attracted to the second display fixing member 940 thereof due to the magnetic field (arrow) of the second display fixing member 940. As a result, when the portable electronic apparatus 40 is in the tablet mode, the bottom surface 104 of the main body 100 and the rear surface 204 of the display unit 200 of the portable electronic apparatus 40 are not separated from and kept fixed to each other.

Although the present embodiment illustrates that the first fixing unit is the magnet, and the second fixing unit is the magnetic body, it is possible that the first fixing unit may be implemented as a magnetic body, and the second fixing unit may be implemented as a magnet. It is also possible that both the first fixing unit and the second fixing unit may be implemented as a magnet.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A portable electronic apparatus comprising:
a main body comprising a top surface on which a keypad is exposed and a bottom surface disposed opposite to the top surface;
a display unit disposed to be hinge-connected to the main body to rotate 360 degrees, and having a front surface to display images and a rear surface disposed opposite to the top front surface; and
a position fixing unit to fix the main body and the display unit at a first position where the top surface of the main body and the front surface of the display unit are in contact with each other and at a second position where the bottom surface of the main body and the rear surface of the display unit are in contact with each other by using a magnetic force,
wherein the position fixing unit comprises;
a first fixing unit provided to the display unit; and
a second fixing unit provided to the main body, and
wherein the first fixing unit comprises at least one display fixing member;
wherein the second fixing unit comprises at least one first main body fixing member and at least one second main body fixing member; and
at the first position, the display fixing member and the first main body fixing member attract each other, and at the second position, the display fixing member and the second main body fixing member attract each other.

2. The portable electronic apparatus of claim 1, wherein the display fixing member is formed to extend so that one side of the display fixing member is placed adjacent to the front surface of the display unit and the other side of the display fixing member is placed adjacent to the rear surface of the display unit;
the first main body fixing member is placed adjacent to the top surface of the main body; and
the second main body fixing member is placed adjacent to the bottom surface of the main body.

3. The portable electronic apparatus of claim 1, wherein the display fixing member is implemented as a magnet; and
the first main body fixing member and the second main body fixing member are implemented as a magnetic body.

4. The portable electronic apparatus of claim 1, wherein:
the display fixing member is implemented as a magnetic body; and
the first main body fixing member and the second main body fixing member are implemented as a magnet.

5. The portable electronic apparatus of claim 1, further comprising:
a detecting sensor provided in at least one of the main body and the display unit, to detect a magnetic field of the position fixing unit; and
a control unit provided in the main body to control an operation of the portable electronic apparatus,
wherein when the detecting sensor detects the magnetic field, the control unit controls the portable electronic apparatus to perform at least one of turning off the keypad, mirroring with other display apparatus, and pre-set applications.

6. The portable electronic apparatus of claim 1, further comprising:
a locking switch provided in at least one of the main body and the display unit, and
a control unit to control the position fixing unit depending on operation of the locking switch,
wherein the position fixing unit comprises an electromagnet, and the control unit adjusts a magnetic force of the electromagnet depending on the on/off of the locking switch.

7. The A portable electronic apparatus comprising:
a main body comprising a top surface on which a keypad is exposed and a bottom surface disposed opposite to the top surface;
a display unit disposed to be hinge-connected to the main body to rotate 360 degrees, and having a front surface to display images and a rear surface disposed opposite to the front surface; and
a position fixing unit to fix the main body and the display unit at a first position where the top surface of the main body and the front surface of the display unit are in contact with each other and at a second position where the bottom surface of the main body and the rear surface of the display unit are in contact with each other by using a magnetic force;
wherein the position fixing unit comprises;
a first fixing unit provided to the display unit; and
a second fixing unit provided to the main body;
wherein the first fixing unit comprises at least one first display fixing member, and at least one second display fixing member;
wherein the second fixing unit comprises at least one main body fixing member; and
wherein at the first position, the first display fixing member and the main body fixing member attract each other, and at the second position, the second display fixing member and the main body fixing member attract each other.

8. The portable electronic apparatus of claim 7, wherein:
the first display fixing member is placed adjacent to the front surface of the display unit;
the second display fixing member is placed adjacent to the rear surface of the display unit; and
the main body fixing member is formed to extend so that one side of the main body fixing member is placed adjacent to the top surface of the main body, and the other side of the main body fixing member is placed adjacent to the bottom surface of the main body.

9. The portable electronic apparatus of claim 7, wherein:
the main body fixing member is implemented as a magnet, and
the first display fixing member and the second display fixing member are implemented as a magnetic body.

10. The portable electronic apparatus of claim 7, wherein:
the main body fixing member is implemented as a magnetic body; and
the first display fixing member and the second display fixing member are implemented as a magnet.

11. The portable electronic apparatus of claim 7, further comprising:
   a detecting sensor provided in at least one of the main body and the display unit, to detect a magnetic field of the position fixing unit; and
   a control unit provided in the main body to control an operation of the portable electronic apparatus,
   wherein when the detecting sensor detects the magnetic field, the control unit controls the portable electronic apparatus to perform at least one of turning off the keypad, mirroring with other display apparatus, and pre-set applications.

12. The portable electronic apparatus of claim 7, further comprising:
   a locking switch provided in at least one of the main body and the display unit, and
   a control unit to control the position fixing unit depending on operation of the locking switch,
   wherein the position fixing unit comprises an electromagnet, and the control unit adjusts a magnetic force of the electromagnet depending on the on/off of the locking switch.

13. The A portable electronic apparatus comprising:
   a main body comprising a top surface on which a keypad is exposed and a bottom surface disposed opposite to the top surface;
   a display unit disposed to be hinge-connected to the main body to rotate 360 degrees, and having a front surface to display images and a rear surface disposed opposite to the front surface; and
   a position fixing unit to fix the main body and the display unit at a first position where the top surface of the main body and the front surface of the display unit are in contact with each other and at a second position where the bottom surface of the main body and the rear surface of the display unit are in contact with each other by using a magnetic force;
   wherein the position fixing unit comprises;
      a first fixing unit provided to the display unit; and
      a second fixing unit provided to the main body, and
   wherein the first fixing unit comprises at least one first display fixing member, and at least one second display fixing member;
   wherein the second fixing unit comprises at least one first main body fixing member, and at least one second main body fixing member; and
   wherein at the first position, the first display fixing member and the first main body fixing member attract each other, and at the second position, the second display fixing member and the second main body fixing member attract each other.

14. The portable electronic apparatus of claim 13, wherein:
   the first display fixing member is placed adjacent to the front surface of the display unit;
   the second display fixing member is placed adjacent to the rear surface of the display unit;
   the first main body fixing member is placed adjacent to the top surface of the main body; and
   the second main body fixing member is placed adjacent to the bottom surface of the main body.

15. The portable electronic apparatus of claim 13, wherein:
   the first display fixing member and the second display fixing member are implemented as a magnet; and
   the first main body fixing member and the second main body fixing member are implemented as a magnetic body.

16. The portable electronic apparatus of claim 13, wherein:
   the first display fixing member and the second display fixing member are implemented as a magnetic body; and
   the first main body fixing member and the second main body fixing member are implemented as a magnet.

17. The portable electronic apparatus of claim 13, wherein:
   the first display fixing member and the second main body fixing member are implemented as a magnet; and
   the second display fixing member and the first main body fixing member are implemented as a magnetic body.

18. The portable electronic apparatus of claim 13, wherein:
   the first display fixing member and the second main body fixing member are implemented as a magnetic body; and
   the second display fixing member and the first main body fixing member are implemented as a magnet.

19. The portable electronic apparatus of claim 13, further comprising:
   a detecting sensor provided in at least one of the main body and the display unit, to detect a magnetic field of the position fixing unit; and
   a control unit provided in the main body to control an operation of the portable electronic apparatus,
   wherein when the detecting sensor detects the magnetic field, the control unit controls the portable electronic apparatus to perform at least one of turning off the keypad, mirroring with other display apparatus, and pre-set applications.

20. The portable electronic apparatus of claim 13, further comprising:
   a locking switch provided in at least one of the main body and the display unit, and
   a control unit to control the position fixing unit depending on operation of the locking switch,
   wherein the position fixing unit comprises an electromagnet, and the control unit adjusts a magnetic force of the electromagnet depending on the on/off of the locking switch.

* * * * *

UNITED STATES PATENT AND TRADEMARK OFFICE
CERTIFICATE OF CORRECTION

PATENT NO. : 9,161,469 B2  Page 1 of 1
APPLICATION NO. : 13/852125
DATED : October 13, 2015
INVENTOR(S) : Jae-uk Han It is certified that error appears in the above-identified patent and that said Letters Patent is hereby corrected as shown below:

In the Claims

Claim 7, Column 14, Line 21

Before "A" delete "The".

Claim 13, Column 15, Line 24

Before "A" delete "The".

Signed and Sealed this
Ninth Day of February, 2016

Michelle K. Lee
*Director of the United States Patent and Trademark Office*